United States Patent [19]
Moslehi

[11] Patent Number: 5,284,804
[45] Date of Patent: Feb. 8, 1994

[54] GLOBAL PLANARIZATION PROCESS

[75] Inventor: Mehrdad M. Moslehi, Dallas, Tex.

[73] Assignee: Texas Instruments Incorporated, Dallas, Tex.

[21] Appl. No.: 816,458

[22] Filed: Dec. 31, 1991

[51] Int. Cl.⁵ .................................... H01L 21/461
[52] U.S. Cl. .................................... 437/228; 437/195; 437/238; 437/240; 437/245; 156/632; 156/653
[58] Field of Search .................. 437/22882, 238, 240, 437/195, 245, 246; 156/632, 653, 626, 627

[56] References Cited

U.S. PATENT DOCUMENTS

| | | | |
|---|---|---|---|
| 4,655,874 | 4/1987 | Marks | 156/643 |
| 4,676,868 | 6/1987 | Riley et al. | 156/643 |
| 4,708,770 | 11/1987 | Pasch | 156/659.1 |
| 4,732,658 | 3/1988 | Lee | 437/228 |
| 4,775,550 | 10/1988 | Chu et al. | 156/653 |
| 4,810,335 | 3/1989 | Hieber | 156/627 |
| 4,839,311 | 6/1989 | Riley et al. | 437/228 |
| 4,962,063 | 10/1990 | Maydan et al. | 437/228 |
| 4,983,545 | 1/1991 | Gokan et al. | 437/228 |
| 5,079,188 | 1/1992 | Kawai | 437/195 |
| 5,110,763 | 5/1992 | Matsumoto | 437/195 |

Primary Examiner—T. N. Quach
Attorney, Agent, or Firm—Jacqueline J. Garner; Richard L. Donaldson; William E. Hiller

[57] ABSTRACT

A novel global planarization process is disclosed which is fully compatible with semiconductor processing. The process disclosed is called metal melt-solidification planarization (MMSP). A layer of a low melting point/high boiling point metal such as tin or a suitable alloy is deposited on a nonplanar wafer surface via physical-vapor deposition or chemical-vapor deposition or evaporation or plating. The wafer is then heated to above the tin melting point, cooled back to resolidify tin, and etched back to form a globally planar surface.

19 Claims, 1 Drawing Sheet

GLOBAL PLANARIZATION PROCESS

BACKGROUND OF THE INVENTION

Surface planarization is an important requirement for device reliability and depth-of-focus (DOF) requirements of advanced optical lithography tools. Depth-of-focus issues arise when attempting to focus a mask pattern on a surface area with uneven topography. The portion of the surface farther away from the imaging camera lens can be out of focus with respect to the portion of the surface closer to the imaging camera lens or vice versa. As the semiconductor technologies are scaled to sub-0.5 micron ($\mu$m) dimensions, improved planarization techniques are required in order to achieve both local and global surface planarization. Local planarization involves planarization over a small portion or lateral scale of an area, while global planarization involves complete planarization over the entire chip area. To date, the following techniques have been proposed or employed for semiconductor device fabrication:

a) spin-on glass (SOG) and etch-back used for local planarization;
b) spin-on resist and etch-back (REB) used for local planarization;
c) in-situ planarized oxide deposition using electron cyclotron resonance, ECR, or plasma used for local planarization;
d) chemical/mechanical polishing (CMP) used for global planarization;
e) plasma deposited polymer films plus etch-back (e.g. that used in Lincoln Lab's work on disposable polymer films for local/global planarization); and
f) phosphosilicate glass (PSG) or borophosposilicate glass (BPSG) reflow used for local planarization.

CMP is the main and until now, the only proven global planarization technique which is being seriously considered for sub-0.5 $\mu$m technologies. However, successful implementations of CMP for semiconductor device manufacturing demands effective post-CMP cleaning process in order to remove the CMP-induced surface contaminants and damage. Much work remains to be done in order to make CMP a fully manufacturable and optimized process.

Figure 1:
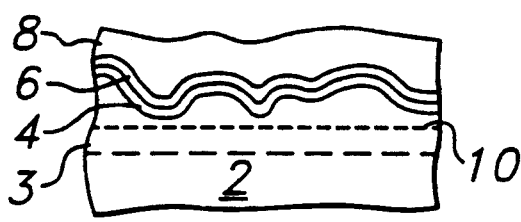
FIG. 1 is a cross-sectional drawing similar to FIG. 1, illustrating the etch-back end-point level before melting and resolidification but after deposition.
Figure 2:
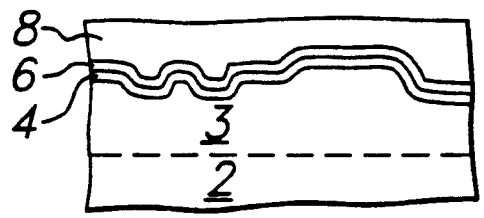
FIG. 2 is a cross-sectional drawing illustrating the resulting planarized structure up to the sixth processing step (after melting and resolidification).

Reference numerals in the figures are carried forward.

DETAILED DESCRIPTION OF THE INVENTION

The invention provides a process which is simple to implement, for global planarization of semiconductor chips. This process provides true global planarization (e.g. on the lateral scale of 1000's of $\mu$m to several centimeters) and can be used instead of CMP. The invention's global planarization process does not employ any mechanical polishing and, as a result, does not require any post-planarization surface cleaning such as the special post-CMP cleaning requirements. This invention is fully compatible with existing semiconductor processing equipment. Moreover, this invention is fully compatible with various metallization systems (e.g. Al/-$SiO_2$, $Cu/SiO_2$, $W/SiO_2$, $Au/SiO_2$ and etc.) and can be employed before and/or after each metal level in multilevel metal technologies. The disclosed process can be appropriately called metal-melt solidification planarization (MMSP). This global planarization process can be used to form planarized dielectric, metal, or semiconductor surfaces. The process flow to be described here is for dielectric planarization. A suggested process flow based on the global planarization of this invention is as follows (assuming a 3-level metal semiconductor technology, although note that technologies with fewer or more levels of metal can suitably be adapted for use with the following process):

1) Complete the device fabrication process flow on a semiconductor wafer through all the steps for fabrication of the active devices. In other words complete the fabrication flow up to a point just prior to the first metal level.

2) Deposit the first interlevel dielectric (ILD) 3 such as PSG or BPSG or undoped oxide (or a stacked combination thereof).

3) Deposit a thin (approximately 400–1000 Å) of a diffused barrier layer 4 such as plasma deposited silicon nitride. This layer is optional depending upon the type of disposable planarization layer used as will be explained further. The barrier layer will act as a diffusion barrier and is disposable. The barrier layer prevents diffusion of the disposable planarization layer atoms into the substrate on which the active devices lie.

4) Deposit a thin (approximately 400–1000 Å) buffer-/adhesion or glue layer 8 of a suitable material, which serves to both adhere to the planarization layer (a layer explained below) and act as a barrier from contamination of the substrate by the planarization layer. Suitable material for the buffer/adhesion layer includes materials such as polysilicon, titanium, aluminum or their alloys. This can be done using physical-vapor deposition (PVD) such as sputtering or this can be done using chemical-vapor deposition (CVD). Other adhesion or glue layer materials may be used.

5) Deposit a relatively thick layer (e.g. a layer 1 $\mu$m to a few microns thick) of a low melting point (a low melting point being considered below 400° C.) and high boiling point (a high boiling point being considered above 1500° C.) elemental metal or suitable alloy. This relatively thick layer shall serve as a disposable planarization layer. Tin, indium and bismuth are considered suitable materials as shown below in table A which indicates melting point and boiling point temperatures at atmospheric pressure in Celsius.

TABLE A

| METAL | MELTING PT. (°C.) | BOILING PT. (°C.) |
|---|---|---|
| Indium | 156.61 | 2080 @ 760 Torr |
| Bismuth | 271.3 | 1560 @ 760 Torr |
| Tin | 231.97 | 2270 @ 760 Torr |

Tin is considered the metal of preferred choice since it meets the melting and boiling point requirements for the planarization layer at melting point temperatures that are not deleterious to conventional metal layers such as aluminum. Restated, the requirements for the planarization layer are that it should melt without evaporating at relatively low temperatures and, therefore, that it have a low vapor pressure at temperatures below 1000° C. Tin is also fairly cheap and abundant. Indium is much more expensive than tin. Bismuth forms low melting point alloys with tin. Bismuth is also fairly cheap.

In general, tin, indium, bismuth or their alloys can be used for the application of this invention due to their low melting points (below 300° C.), high boiling points, and very low vapor pressures below 1000° C. In fact, their vapor pressures are extremely low at less than 500° C.

The deposition process for the planarization layer can be accomplished by a physical-vapor deposition process (PVD) such as sputtering or it can be accomplished by chemical-vapor deposition (CVD) if a CVD precursor is available. For tin, tin tetrachlorie ($SnCl_4$) and tin hydride ($SnH_4$) may be used as suitable CVD precursors. The thickness of a sputtered or evaporated (or CVD-formed) tin planarization layer is selected such that sufficient tin material layer is available to cover the entire nonplanar topography when molten planar tin metal is formed later on. In general, the tin layer thicknesses of 1-4 $\mu m$ are sufficiently large to achieve global planarization over semiconductor integrated circuits.

As indicated above the barrier layer is not always needed. This is likely the case when tin is used as the disposable planarization layer. Tin is a column IV metal in the periodic table as is silicon the likely semiconductor substrate. Therefore, tin does not act as a generation/recombination (defect) center with respect to a silicon semiconductor substrate. Consequently, the barrier layer can probably be omitted with this planarization layer/substrate combination.

FIG. 1 is a cross-sectional drawing illustrating the resulting structure from the foregoing processing steps. Shown in FIG. 1 are substrate 2, interlevel dielectric layer 3, adhesion layer 6, barrier layer 4 and planarization layer 8.

The process is continued as follows:

6) Heat the wafer to above the melting point of tin but below, for instance, 500° C., a temperature which will not degrade lower metal layers. The wafer can be heated, for example, in an inert ambient such as in argon to 250° to 400° C. for a few seconds to a few minutes. The heating beyond the melting point of tin will produce a liquid metal film. Surface tension forces will produce a completely flat tin melt surface which is planar on both local and global scales. Note that in selecting a material suitable for a planarization layer the surface tension forces must overcome the viscosity forces. Once again, for this requirement, tin is a suitable choice for the planarization layer since, for instance, at 300° C. tin has a surface tension force of more than 550 mN/m and a low viscosity of 1.73 cp (similar to isopropyl alcohol). Therefore, excellent large-scale/global planarization is expected when the wafer is heated to 300° C. and then cooled back to near room temperature (for tin to resolidify) as explained in the subsequent process step. Note that the wafer heating can take place in-situ during or after the tin sputter deposition or CVD-based deposition process. The heating temperature is low enough (below approximately 400° C.) so that the tin does not diffuse through the underlying barrier and dielectric layers. Moreover, the metal melt has sufficiently low viscosity and large surface tension forces to extend the planar melt (molten tin) surface on a global scale.

7) Remove the wafer from the heated area or alternatively turn the thermal energy source off. This will cause the solidification of the planarized tin melt and form a globally planarized solid tin melt surface. Tin expands slightly upon solidification. This slight expansion is accommodated in the vertical direction resulting in only a slightly larger solid planarized tin thickness compared to the melt thickness.

Figure 3:
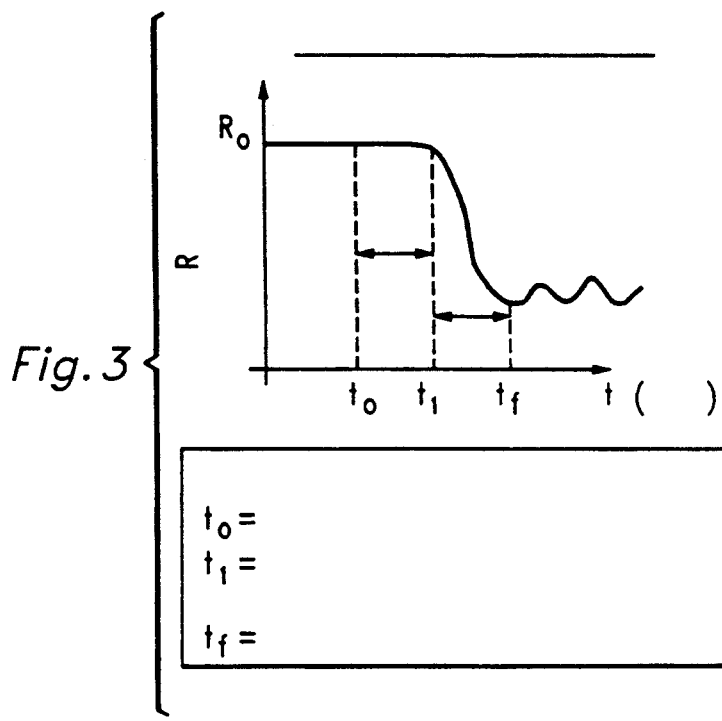
FIG. 3 illustrates a graph of the surface reflectance R versus time t used for planarization process end-point detection.
Figure 4:
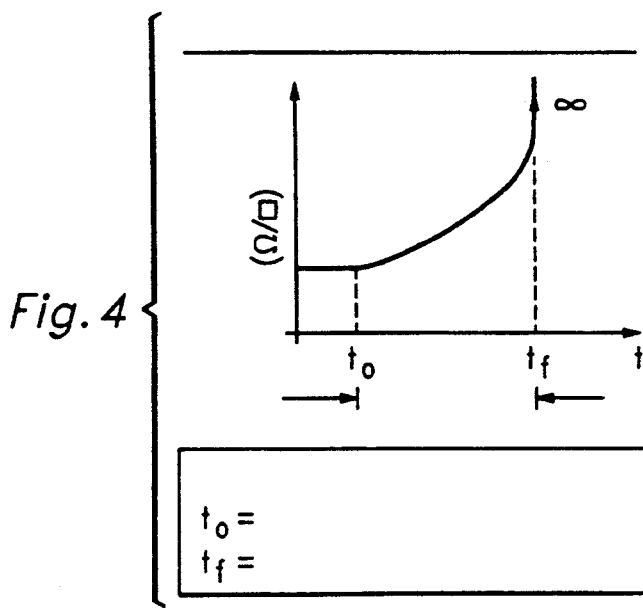
FIG. 4 illustrates a graph showing sheet resistance measured in ohms per square versus etch time t which is also useful for planarization process end-point detection.
Figure 5:
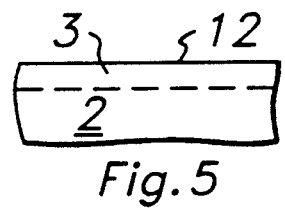
FIG. 5 is a cross-sectional which illustrates the resulting structure after the etch-back step indicating a globally planarized surface.

8) Perform a blanket etch process such that the etch rates for tin and the ILD (as well as the thin glue and barrier layers) are similar (i.e. 1/1 selectivity—In general, the etch-back process must have a 1:1 selectivity between tin and the underlayers for instance, oxide dielectric as well as the nitride barrier and TiW or TiN adhesion/glue layers. Good etch uniformity is required.). This may be accomplished with a suitable reactive ion etch (RIE) or sputter etch process. The sputter etch process for tin etch-back can be replaced with an RIE process if a suitable etch chemistry is available. The uniform blanket etch is continued until all the tin and the initial ILD surface topography are completely removed. The etch-stop level can be easily detected by using an in-situ surface reflectance sensor which detects the end-point for the etch process breaking through the lowest tin-containing regions. This will result in a globally planar ILD surface. An in-situ laser-based surface reflectance sensor can easily detect the end-point for the etch-back process. This is due to the fact that the surface reflectance will start to decrease (or change) rapidly when the etch-back process reaches the underlayer peaks by breaking through the resolidified tin layer. FIG. 3 illustrates a qualitative graph of the surface reflectance R versus time t. The reflectance is measured for this case using a 1.3 or 1.55 $\mu m$ wavelength large-diameter (e.g. 1-10 mm) laser beam. A surface reflectance of $R_0$ is obtained at the very beginning of the etch period which begins at $t_0$. Time $t_1$ indicates the time at which the etch-back process arrives at the underlayer's highest peak, while $t_f$ indicates an optimal etch end-point detected via surface reflectance. After a time $t_f$, fringes may exist in the reflectance signal due to dielectric etch. Consequently, global planarization occurs within a time $t_1$ and $t_f$ with $t_f$ shown here as representative of the most suitable etch time. The reflectance measurement process discussed here is compatible with face-up, face-down and vertical wafer processing schemes. As a result of surface reflectance use for determining the etch end-point level, it is desirable to provide a planarization layer which also offers good reflectivity. Tin is a silvery white metal while indium is silvery-white in color. Both offer good surface reflectivity. For instance, indium can be plated onto metals and evaporated onto glass to a form a mirror as good as those made with silver. Alternatively, the etch-back end-point process can use an electrical end-point instead of an optical end-point. For instance, a two-point probe may be used in order to monitor the metal sheet resistance (tin sheet resistance) in real time. FIG. 4 illustrates a qualitative graph showing sheet resistance measured in ohms per square versus etch time t. The sheet resistance measurement can be taken from 2-point probe data. Time $t_0$ represents the etch-back start time while time $t_f$ represents the etch-back end-point or stop time. FIG. 5 is a cross-sectional drawing similar to FIG. 1, with the exception that etch line 10 illustrates the etch back end-point level (shown as dielectric surface 1 (in FIG. 5). FIG. 5 illustrates the resulting structure after the foregoing processing steps. Note that a planar surface 12 which extends globally now exists. If necessary a dielectric deposition step can be performed to make the ILD (the globally planar ILD) thicker after the tin etch-back step. The remaining process steps proceed as follows:

9) Proceed with the fabrication of the metal level.
10) Deposit an interlevel dielectric (ILD).
11) Repeat steps 3 through 8 to complete the next planarization level.
12) Repeat the process sequence until all the metal levels desired are fabricated.

Note that the entire sequence of planarization steps (tin sputter deposition or tin CVD, wafer heating/tin melting, wafer cooling/tin solidification, tin etch-back) can be performed in-situ within a single PVD or CVD chamber.

The deposition process of the planarization layer can be performed while the wafer is heated to above the melting point of tin (e.g. between 232° C. and 400° C.). This will result in formation of globally planar tin melt during the deposition. As a result, the two steps of tin deposition and melt resolidification can be performed in a single process step.

Although the invention has been described in detail herein with reference to its preferred embodiments and certain described alternatives, it is to be understood that this description is by way of example only, and it is not to be construed in a limiting sense. It is further understood that numerous changes in the details of the embodiments of the invention, and additional embodiments of the invention, will be apparent to, and may be made by persons of ordinary skill in the art having reference to this description. For instance, note that the adhesion/buffer layer may not always be necessary. Although tin was specifically cited as the preferred choice for the planarization layer, other materials meeting the guidelines set forth above can be easily substituted. For instance, indium or bismuth can be used. Additionally note that alloys of the metals listed above can be used. Further, the foregoing disclosed invention is fully compatible with back-end device processing. It is contemplated that all such changes and additional embodiments are within the spirit and true scope of the invention as claimed below.

I claim:

1. A method of planarizing a structure lying on a substrate comprising:
   depositing a disposable planarization layer which is in solid form at room temperature;
   forming a liquid melt from said planarization layer over the substrate so as to form a planar liquid melt surface;
   solidifying said melt so as to form a planar solid layer;
   etching back said planar solid layer to a predetermined level on said structure.

2. A method as recited in claim 1 wherein said liquid melt is formed from a material having greater surface tension forces than forces of viscosity.

3. A method as recited in claim 1 wherein said substrate is formed of semiconductor material.

4. A method of planarizing an interlevel dielectric layer on a substrate comprising:
   placing an interlevel dielectric layer over said substrate;
   placing an adhesion layer over said interlevel dielectric;
   placing a planarization layer over said adhesion layer;
   melting, planarizing and resolidifying said planarization layer via heating and cooling said substrate; and
   etching-back said planarization layer into said interlevel dielectric layer so as to form a planar surface on said interlevel dielectric layer.

5. A method as recited in claim 4 wherein said etch-back is performed with an etch process including a 1-to-1 etchant selectivity as between said planarization layer and said interlevel dielectric layer.

6. A method as recited in claim 4 wherein a barrier layer is placed on said interlevel dielectric and said adhesion layer is placed over said barrier layer.

7. A method as recited in claim 6 wherein said barrier layer comprises $Si_3N_4$ or silicon oxynitride.

8. A method as recited in claim 6 wherein said barrier layer is a plasma deposited silicon nitride material.

9. A method as recited in claim 4 wherein said interlevel dielectric is deposited over said substrate.

10. A method as recited in claim 4 wherein said interlevel dielectric layer comprises a dielectric selected from the group consisting of phosophosilicate glass or borophosphosilicate glass, undoped oxide or a combination thereof.

11. A method as recited in claim 4 wherein said adhesion layer comprises a material selected from the group consisting of titanium, silicon or aluminum.

12. A method as recited in claim 11 wherein said adhesion layer comprises a material selected from the group consisting of TiW or TiN.

13. A method as recited in claim 4 wherein said planarization layer is selected from the group consisting of tin, tin alloy, bismuth, bismuth alloy, indium, indium alloy, or a combination thereof.

14. A method as recited in claim 4 wherein said adhesion layer serves as a buffer against contaminants to said substrate.

15. A method as recited in claim 4 wherein said adhesion layer is deposited according to a method selected from the group consisting of physical-vapor deposition or chemical-vapor deposition.

16. A method as recited in claim 4 wherein said planarization layer is deposited over said adhesion layer according to a physical-deposition process or chemical-deposition process or an evaporation or plating process.

17. A method of planarizing an interlevel dielectric layer on a substrate comprising:
    placing an interlevel dielectric layer over said substrate;
    placing an adhesion layer over said interlevel dielectric;
    placing a planarization layer over said adhesion layer;
    melting, planarizing, and resolidifying said planarization layer via heating and cooling said substrate;

etching-back said planarization layer into said interlevel dielectric layer until detecting an etch-back end-point level.

18. A method as recited in claim 17 wherein said etch-back end-point level is detected using a method of measuring surface reflectance.

19. A method as recited in claim 17 wherein said etch-back end-point is detected using a method of measuring electrical sheet resistance.

* * * * *